United States Patent
Tsai et al.

(10) Patent No.: US 8,941,295 B2
(45) Date of Patent: Jan. 27, 2015

(54) FLUORESCENT MATERIAL AND ILLUMINATION DEVICE

(71) Applicants: Kai-Shon Tsai, New Taipei (TW); Chien-Li Lee, New Taipei (TW)

(72) Inventors: Kai-Shon Tsai, New Taipei (TW); Chien-Li Lee, New Taipei (TW)

(*) Notice: Subject to any disclaimer, the term of this patent is extended or adjusted under 35 U.S.C. 154(b) by 89 days.

(21) Appl. No.: 13/873,120

(22) Filed: Apr. 29, 2013

(65) Prior Publication Data

US 2014/0319996 A1    Oct. 30, 2014

(51) Int. Cl.
*H01J 1/62* (2006.01)
*C09K 11/02* (2006.01)
*C09K 11/77* (2006.01)
*H05B 33/12* (2006.01)

(52) U.S. Cl.
CPC ......... *C09K 11/7774* (2013.01); *C09K 11/7767* (2013.01); *H05B 33/12* (2013.01)
USPC ................................... 313/503; 252/301.4 R (58) Field of Classification Search
CPC ........ C09K 11/64; C09K 11/08; C09K 11/62; C09K 11/7721; C09K 11/7715; C09K 11/7734
USPC ..................... 252/301.4 R; 313/498–503
See application file for complete search history.

(56) References Cited

U.S. PATENT DOCUMENTS

| | | | |
|---|---|---|---|
| 5,998,925 A | 12/1999 | Shimizu | |
| 8,226,363 B2 | 7/2012 | Flock et al. | |
| 8,608,980 B2 * | 12/2013 | Shioi et al. | 252/301.4 F |
| 8,636,920 B2 * | 1/2014 | Kijima et al. | 252/301.4 F |
| 8,663,498 B2 * | 3/2014 | Masuda et al. | 252/301.4 F |
| 2010/0142182 A1 | 6/2010 | Van Woudenberg et al. | |

* cited by examiner

*Primary Examiner* — Anne Hines
(74) *Attorney, Agent, or Firm* — DLA Piper LLP (US)

(57) ABSTRACT

A fluorescent material is represented by the following formula (I):

$$M^1_y M^2_n O_z N_x : M^3_w \quad (I);$$

wherein $M^1$ is selected from $Sc^{3+}$, $Y^{3+}$, $La^{3+}$, $Sm^{3+}$, $Gd^{3+}$, $Pm^{3+}$, $Er^{3+}$, $Lu^{3+}$, and combinations thereof; $M^2$ is selected from $Al^{3+}$, $In^{3+}$, $Ga^{3+}$, and combinations thereof; $M^3$ is selected from $Tm^{3+}$, $Bi^{3+}$, $Tb^{3+}$, $Ce^{3+}$, $Eu^{3+}$, $Mn^{3+}$, $Er^{3+}$, $Yb^{3+}$, $Ho^{3+}$, $Gd^{3+}$, $Pr^{3+}$, $Dy^{3+}$, $Nd^{3+}$, and combinations thereof; $0.6 \leq x/n \leq 1.6$, $0.54 \leq y/n \leq 0.6$, $0 < w/n \leq 0.06$, and $0 \leq z/n \leq 1.5$. An illumination device including a light emitting element and the aforesaid fluorescent material is also disclosed.

8 Claims, 6 Drawing Sheets

FLUORESCENT MATERIAL AND ILLUMINATION DEVICE

BACKGROUND OF THE INVENTION

1. Field of the Invention

This invention relates to a fluorescent material and an illumination device composed of the fluorescent material.

2. Description of the Related Art

Nichia Corporation started to produce white light emitting diodes (white LEDs) since 1996. U.S. Pat. No. 5,998,925 discloses a light emitting device that generates white light and that comprises a blue light emitting diode (blue LED) having a wavelength ranging from 450 nm to 470 nm as an illuminating unit, and a Cerium-doped fluorescent material ($Y_3Al_5O_{12}$:$Ce^{3+}$, also known as YAG:$Ce^{3+}$), wherein Cerium is used as an activator. Part of blue light emitted from the illuminating unit is absorbed by YAG:$Ce^{3+}$ and converted into yellowish light with a relatively broader emission spectrum (the peak wavelength is around 580 nm). Because massive yellow light irradiated by YAG:$Ce^{3+}$ is capable of stimulating both red light and green light photoreceptors in human eyes, and the rest of blue light emitted from the blue light LED stimulates blue light photoreceptors, white light could be seen by human eyes.

However, such combination of blue LED and YAG fluorescent material has several defects including low color rendering index (Ra) owing to lack of red light, lower light emitting efficiency with increasing operating temperature, and poor thermal stability of illuminated light induced by high power light sources.

In order to improve the aforesaid defects, many researchers have focused on adding silicon (Si) or sulfur (S) elements into the composition of YAG. Silicon compound fluorescent materials, in which $Al^{3+}$ is replaced by $Si^{4+}$, have drawn more attention due to higher thermal and chemical stabilities, stronger absorption in UV zone, high purity and low cost, and abundant supply with respect to silicon or silicate materials.

US Patent Application Publication No. 2010/0142182 discloses an illumination system, comprising a light emitting device which includes a first phosphor layer, and a second phosphor layer which is separated from the light emitting device. The first phosphor layer includes a fluorescent material which contains silicon and nitrogen elements and which is represented by the following formula:

$(Y_{1-\alpha-\beta}Lu_\alpha Gd_\beta)_3(Al_{5-u-v}Ga_u Si_v)O_{12-v}N_v$:$Ce^{3+}$);

wherein $0 \le \alpha < 1$, $0 \le \beta < 1$, $0 < (\alpha+\beta+a+b) \le 1$, $0 \le u \le 1$, $0 < v < 1$, and $0 < a \le 0.2$.

This fluorescent material has been modified based on the YAG structure. However, drawbacks of this silicon-containing fluorescent material include low bearing temperature, low stability, and relatively high brightness which causes over stimulation and results in fatigue of human eyes after exposure over a long period of time. Also, although nitrogen element has also been added to raise the sintering temperature, the fluorescent material still only has a sintering temperature of approximately 1500° C. Besides, the bearing temperature and stability are still insufficient and the color rendering index (Ra) of the modified fluorescent material is about 80% which is still similar to that of the original YAG. Moreover, higher quantity of the fluorescent material is needed in the illumination system.

Therefore, there is a need in the art to provide a fluorescent material that has high bearing temperature, high color rendering index, good thermal stability, and more natural light emission to avoid over stimulation of human eyes.

SUMMARY OF THE INVENTION

Therefore, the object of the present invention is to provide a fluorescent material with desirably high bearing temperature and high color rendering index (Ra), and an illumination device including the aforesaid fluorescent material.

According to one aspect of this invention, a fluorescent material is represented by the following formula (I):

$$M^1_y M^2_n O_z N_x : M^3_w \qquad (I);$$

wherein $M^1$ is selected from the group consisting of $Sc^{3+}$, $Y^{3+}$, $La^{3+}$, $Sm^{3+}$, $Gd^{3+}$, $Pm^{3+}$, $Er^{3+}$, $Lu^{3+}$, and combinations thereof; $M^2$ is selected from the group consisting of $Al^{3+}$, $In^{3+}$, $Ga^{3+}$, and combinations thereof; $M^3$ is selected from the group consisting of $Tm^{3+}$, $Bi^{3+}$, $Tb^{3+}$, $Ce^{3+}$, $Eu^{3+}$, $Mn^{3+}$, $Er^{3+}$, $Yb^{3+}$, $Ho^{3+}$, $Gd^{3+}$, $Pr^{3+}$, $Dy^{3+}$, $Nd^{3+}$, and combinations thereof; $0.6 \le x/n \le 1.6$, $0.54 \le y/n \le 0.6$, $0 < w/n \le 0.06$, and $0 \le z/n \le 1.5$.

According to another aspect of the invention, an illumination device comprises a light emitting element, and a fluorescent layer that is formed on the light emitting element. The fluorescent layer includes the fluorescent material mentioned above, and is capable of absorbing light emitting from the light emitting element.

This invention has the following effects:

a) the fluorescent material is capable of emitting specific light in desired ranges of wavelengths by altering different elements in the fluorescent material;

b) the fluorescent material does not comprise silicon or sulfur elements, and part or all of the oxygen elements in the fluorescent material have been replaced by nitrogen elements, thermal stability and bearing temperature are increased accordingly via covalent bonding structure of the nitrogen atoms; and c) light emitted from the illumination device of this invention is more natural and has higher color rendering index (Ra).

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

According to the present invention, a fluorescent material is represented by the following formula (I):

$$M^1_y M^2_n O_z N_x : M^3_w \qquad (I)$$

wherein $M^1$ is a trivalent rare earth ion as an activator of the fluorescent material and is selected from the group consisting of $Sc^{3+}$, $Y^{3+}$, $La^{3+}$, $Sm^{3+}$, $Gd^{3+}$, $Pm^{3+}$, $Er^{3+}$, $Lu^{3+}$, and combinations thereof. $M^2$ is a cationic lattice selected from the group consisting of $Al^{3+}$, $In^{3+}$, $Ga^{3+}$, and combinations thereof. $M^3$ is a doped co-activator (also called a light intensifier) which is capable of prolonging the fluorescent light emission time and enhancing the photoluminescence effect of the fluorescent material. $M^3$ is selected from the group consisting of $Tm^{3+}$, $Bi^{3+}$, $Tb^{3+}$, $Ce^{3+}$, $Eu^{3+}$, $Mn^{3+}$, $Er^{3+}$, $Yb^{3+}$, $Ho^{3+}$, $Gd^{3+}$, $Pr^{3+}$, $Dy^{3+}$, $Nd^{3+}$, and combinations thereof.

In formula (I), $0.6 \leq x/n \leq 1.6$, $0.54 \leq y/n \leq 0.6$, $0 < w/n \leq 0.06$, and $0 \leq z/n \leq 1.5$.

Therefore, when $n=5$, $3 \leq x \leq 8$, $2.7 \leq y \leq 3$, $0 < w \leq 0.03$, and $0 \leq z \leq 7.5$.

Preferably, $M^1$ and $M^3$ cannot be the same.

By virtue of the combination of the specific components, the fluorescent material of this invention is capable of illuminating light with a desired wavelength range. Moreover, since part or all of the oxygen atoms are substituted with nitrogen atoms in the fluorescent material, bonding strength has increased because of the covalent bonding structure of nitrogen atoms. Thermal stability and bearing temperature of the fluorescent material are accordingly increased and the sintering temperature is around 1800° C.

When the activator $M^3$ of the fluorescent material comprises $Tm^{3+}$ or $Bi^{3+}$, the fluorescent material illuminates blue light. When the activator $M^{3+}$ comprises $Tb^{3+}$ or $Ce^{3+}$, the fluorescent material illuminates yellow-green light. When the activator $M^3$ comprises $Eu^{3+}$ or $Mn^{3+}$, the fluorescent material illuminates red light. The activator ($M^{3+}$) of the fluorescent material not only correlates to the wavelength of emitted light but also intensifies the luminescence effect of the fluorescent material.

Preferably, w/n ranges from 0.002 to 0.012. When w/n is less than 0.002, the luminous intensity is insufficient. On the other hand, when w/n is greater than 0.012, the wavelength of emission light would be increased, which results in lower luminous intensity. More preferably, w ranges from 0.002 to 0.006.

Preferably, the fluorescent material is selected from the group consisting of $Y_{2.98}Al_5O_{7.5}N_3{:}Tm_{0.02}$, $Y_{2.95}Al_5O_6N_4{:}Bi_{0.05}$, $Y_{2.94}Al_5O_6N_4{:}Tb_{0.06}$, $Y_{2.95}Al_5O_{7.5}N_3{:}Ce_{0.05}$, $Y_{2.95}Al_5O_6N_4{:}Ce_{0.05}$, $Y_{2.95}Al_5O_{4.5}N_5{:}Ce_{0.05}$, $Y_{2.95}Al_5O_6N_4{:}Mn_{0.05}$, $Y_{2.75}GaAl_4O_6N_4{:}Mn_{0.25}$, $Y_{2.94}Al_5N_8{:}Bi_{0.06}$, $Y_{2.94}Al_5N_8{:}Tm_{0.06}$, $Y_{2.95}Al_5N_8{:}Ce_{0.05}$, $Y_{2.95}Al_5N_8{:}Mn_{0.05}$, $Y_{2.95}Ga_5N_8{:}Mn_{0.05}$, $Y_{2.94}Al_5O_6N_4{:}Y_{2.94}Al_5O_6N_4{:}Mn_{0.06}$, $Y_{2.94}Al_5O_6N_4{:}Ce_{0.06}$, $Lu_{1.72}Gd_{1.2}Al_5O_6N_4{:}Ce_{0.05}Pr_{0.03}$, $Lu_{1.72}Er_1Ga_5O_{4.5}N_5{:}Mn_{0.25}Dy_{0.03}$, $Lu_{1.92}Sc_1Al_5O_6N_4{:}Ce_{0.05}Yb_{0.03}$, $Sm_{1.92}La_1Al_5O_6N_4{:}Ce_{0.05}Ho_{0.03}$, $Y_{2.32}Gd_{0.6}In_1Al_4O_6N_4{:}Ce_{0.05}Nd_{0.03}$, and $Lu_{1.95}Pm_1Al_5O_6N_4{:}Ce_{0.05}$.

Preferably, the emission wavelength for the fluorescent material ranges from 380 nm to 700 nm. When $M^{3+}$ comprises $Tb^{3+}$, $Er^{3+}$, $Yb^{3+}$ or $Ho^{3+}$, the emission wavelength ranges from 380 nm to 530 nm. When $M^{3+}$ comprises $Gd^{3+}$, $Pr^{3+}$, $Dy^{3+}$, or $Nd^{3+}$, the emission wavelength ranges from 530 nm to 700 nm.

Preferably, the fluorescent material has an excitation wavelength ranging from 250 nm to 500 nm.

Preferably, the fluorescent material has a particle size ranging from 50 nm to 10 μm.

The fluorescent material can be produced by, but is not limited to, solid-state reaction method, sol-gel reaction method, or co-precipitation method.

Preferably, the fluorescent material is produced by the solid-state reaction method. Because of its relatively simple process, it may be easily applied in manufacturing large quantity of the fluorescent material. More preferably, the sintering temperature used in the solid-state reaction method is 1800° C., and temperature of reduction is 1500° C.

This invention also provides an illumination device which comprises a light emitting element configured as a light source, and the aforesaid fluorescent material disposed on the light emitting element. The fluorescent material can absorb part of light from the light emitting element and emits light by photoluminescence effect.

Preferably, the light emitting element includes a chip containing, for example, aluminum, gallium, nitrogen, phosphorus, and combinations thereof. More preferably, the light emitting diode unit is a LED chip emitting purple, blue, or green light.

Preferably, light emission spectrum of the light emitting element has a peak wavelength ranging from 350 nm to 500 nm.

Preferably, the fluorescent material is formed on the light emitting element via vapor deposition method. More preferably, the fluorescent material forms a thin film on the light emitting element, and the thin film has a smooth surface.

EXAMPLES

Source of Chemicals

1. Bismuth(III)oxide ($Bi_2O_3$): commercially available from ACROS Organics, 99.9% of purity, reagent grade.
2. Barium fluoride ($BaF_2$): commercially available from ACROS Organics, 99.9% of purity, reagent grade.
3. Thulium(III)oxide ($Tm_2O_3$): commercially available from ACROS Organics, 99.9% of purity, reagent grade.
4. Cerium(IV)oxide ($CeO_2$): commercially available from ACROS Organics, 99.9% of purity, reagent grade.
5. Ammonium bicarbonate ($NH_4HCO_3$): commercially available from ACROS Organics, 99.9% of purity, reagent grade.
6. Manganese dioxide ($MnO_2$): commercially available from ACROS Organics, 99.9% of purity, reagent grade.
7. Yttrium(III)oxide ($Y_2O_3$): commercially available from ACROS Organics, 99.9% of purity, reagent grade.
8. Aluminum oxide ($Al_2O_3$): commercially available from ACROS Organics, 99.9% of purity, reagent grade.
9. Bismuth(IV)oxide ($BiO_2$): commercially available from ACROS Organics, 99.9% of purity, reagent grade.
10. Terbium(III, IV)oxide ($Tb_4O_7$): commercially available from ACROS Organics, 99.9% of purity, reagent grade.
11. Gallium(III)oxide ($Ga_2O_3$): commercially available from ACROS Organics, 99.9% of purity, reagent grade.
12. Gadolinium(III)oxide ($Gd_2O_3$): commercially available from ACROS Organics, 99.9% of purity, reagent grade.
13. Lutetium(III)oxide ($Lu_2O_3$): commercially available from ACROS Organics, 99.9% of purity, reagent grade.
14. Erbium(III)oxide ($Er_2O_3$): commercially available from ACROS Organics, 99.9% of purity, reagent grade.
15. Dysprosium(III)oxide ($Dy_2O_3$): commercially available from ACROS Organics, 99.9% of purity, reagent grade.
16. Praseodymium(III, IV)oxide ($Pr_6O_{11}$): commercially available from ACROS Organics, 99.9% of purity, reagent grade.
17. Scandium(III)oxide ($Sc_2O_3$): commercially available from ACROS Organics, 99.9% of purity, reagent grade.
18. Ytterbium (III)oxide ($Yb_2O_3$): commercially available from ACROS Organics, 99.9% of purity, reagent grade.
19. Samarium(III)oxide ($Sm_2O_3$): commercially available from ACROS Organics, 99.9% of purity, reagent grade.
20. Holmium(III)oxide ($Ho_2O_3$): commercially available from ACROS Organics, 99.9% of purity, reagent grade.
21. Neodymium(III)oxide ($Nd_2O_3$): commercially available from ACROS Organics, 99.9% of purity, reagent grade.

22. Promethium(III)oxide ($Pm_2O_3$): commercially available from ACROS Organics, 99.9% of purity, reagent grade.

23. Barium magnesium aluminate ($BaMgAl_{10}O_{17}$, also known as BAM): commercially available from Nemoto & Co. Ltd.

24. Cerium(III)-doped Yttrium aluminum garnet (also known as YAG:Ce): commercially available from Nemoto & Co. Ltd.

25. Europium(III)-doped Yttrium aluminum garnet (also known as YAG:Eu): commercially available from Nemoto & Co. Ltd.

26. Yttrium nitride (YN): synthesized from $YCl_3$ and $Li_3N$ under a nitrogen gas atmosphere at 1800° C.

27. Aluminum nitride (AlN): synthesized from $AlCl_3$ and $Li_3N$ under a nitrogen gas atmosphere at 1800° C.

28. Cerium nitride (CeN): synthesized from $CeCl_3$ and $Li_3N$ under a nitrogen gas atmosphere at 1800° C.

29. Gallium nitride (GaN): synthesized from $GaCl_3$ and $Li_3N$ under a nitrogen gas atmosphere at 1800° C.

Example 1

Preparation of Fluorescent Material 33.65 grams of $Y_2O_3$ (precursor for $M^1$), 0.39 grams of $Tm_2O_3$ (precursor for $M^3$), 20.39 grams of $Al_2O_3$ (precursor for $M^2$), 4.10 grams of AlN (precursor for $M^2$), and 2.9 grams of $BaF_2$ as a flux agent were mixed together to form a mixture. The mixture was disposed in a crucible, followed by heating to 1650° C. with 5° C./min increasing rate and calcining for 24 hours under a nitrogen gas atmosphere. The reaction product was then cooled to room temperature with 5° C./min decreasing rate, followed by pulverizing, washing, drying, and sieving using a #400 mesh sieve. After reducing at 1500° C. for 12 hours under a reducing atmosphere of nitrogen gas and hydrogen gas (85%/15% by volume), a fluorescent powder of example 1 was obtained.

Photoluminescence Test

The fluorescent powder of example 1 was excited by purple light with a 400 nm peak wavelength, and emission spectrum thereof was measured by virtue of photoluminescence effect. The fluorescent powder of example 1 emits blue light with a 460 nm peak wavelength.

Example 2~25

The methods for preparing fluorescent materials of examples 2 to 25 were the same as that of example 1, except for ingredients and amounts of the ingredients. The ingredients and the amounts of the ingredients for Examples 2 to 25 are shown in Table 1. The colors and peak wavelengths of excitation light and emission light for Examples 2 to 25 are disclosed in Table 2.

Comparative Example 1~4

Fluorescent powders for Comparative examples 1 to 3 were commercially available and were YAG:Ce, YAG:Eu, and BAM, respectively.

A fluorescent powder of Comparative example 4, $Y_3Al_2O_{7.5}$:Ce, was obtained using the same method as that of example 1. Ingredients and amounts of the ingredients for Comparative example 4 can also be found in Table 1.

Photoluminescence tests for Comparative examples 1 to 4 were performed as well, and results are disclosed in Table 2.

TABLE 1

| Exp. | Formula | $M^1$ (g) | $M^2$ (g) | $M^3$ (g) | flux agent |
|---|---|---|---|---|---|
| 1 | $Y_{2.98}Al_5O_{7.5}N_3$:$Tm_{0.02}$ | $Y_2O_3$ 16.8 g | $Al_2O_3$ 5.1 g AlN 6.15 g | $Tm_2O_3$ 0.19 g | $BaF_2$ 2~3g |
| 2 | $Y_{2.95}Al_5O_6N_4$:$Bi_{0.05}$ | $Y_2O_3$ 16.65 g | $Al_2O_3$ 2.55 g AlN 8.2 g | $BiO_2$ 0.58 g | $BaF_2$ 2~3 g |
| 3 | $Y_{2.94}Al_5O_6N_4$:$Tb_{0.06}$ | $Y_2O_3$ 16.6 g | $Al_2O_3$ 2.55 g AlN 8.2 g | $Tb_4O_7$ 0.56 g | $BaF_2$ 2~3 g |
| 4 | $Y_{2.95}Al_5O_{7.5}N_3$:$Ce_{0.05}$ | $Y_2O_3$ 16.65 g | $Al_2O_3$ 5.1 g AlN 6.15 g | $CeO_2$ 0.43 g | BaF2 2~3 g |
| 5 | $Y_{2.95}Al_5O_6N_4$:$Ce_{0.05}$ | $Y_2O_3$ 16.65 g | $Al_2O_3$ 2.55 g AlN 8.2 g | $CeO_2$ 0.43 g | $BaF_2$ 2~3 g |
| 6 | $Y_{2.95}Al_5O_{4.5}N_5$:$Ce_{0.05}$ | $Y_2O$ 16.65 g | AlN 10.25 g | $CeO_2$ 0.43 g | $BaF_2$ 2~3 g |
| 7 | $Y_{2.95}Al_5O_6N_4$:$Mn_{0.05}$ | $Y_2O_3$ 16.65 g | $Al_2O_3$ 2.55 g AlN 8.2 g | $MnO_2$ 0.22 g | $BaF_2$ 2~3 g |
| 8 | $Y_{2.75}GaAl_4O_6N_4$:$Mn_{0.25}$ | $Y_2O_3$ 15.52 g | $Ga_2O_3$ 4.69 g AlN 8.2 g | $MnO_2$ 1.09 g | $BaF_2$ 2~3 g |
| 9 | $Y_{2.94}Al_5N_8$:$Bi_{0.06}$ | YN 15.13 g | AlN 10.25 g | $Bi_2O_3$ 0.7 g | $BaF_2$ 2~3 g |
| 10 | $Y_{2.94}Al_5N_8$:$Tm_{0.06}$ | YN 15.13 g | AlN 10.25 g | $Tm_2O_3$ 0.58 g | $BaF_2$ 2~3 g |
| 11 | $Y_{2.95}Al_5N_8$:$Ce_{0.05}$ | YN 15.18 g | AlN 10.25 g | $CeO_2$ 0.43 g | $BaF_2$ 2~3 g |
| 12 | $Y_{2.95}Al_5N_8$:$Ce_{0.05}$ | YN 15.18 g | AlN 10.25 g | CeN 0.42 g | $BaF_2$ 2~3 g |
| 13 | $Y_{2.95}Al_5N_8$:$Mn_{0.05}$ | YN 15.18 g | AlN 10.25 g | $MnO_2$ 0.22 g | $BaF_2$ 2~3 g |
| 14 | $Y_{2.95}Ga_5N_8$:$Mn_{0.05}$ | YN 15.18 g | GaN 20.93 g | $MnO_2$ 0.22 g | $BaF_2$ 2~3 g |
| 15 | $Y_{2.94}Al_5O_6N_4$:$Bi_{0.06}$ | $Y_2O_3$ 16.6 g | $Al_2O_3$ 2.55 g AlN 8.2 g | $BiO_2$ 0.7 g | $BaF_2$ 2~3 g |
| 16 | $Y_{2.94}Al_5O_6N_4$:$Mn_{0.06}$ | $Y_2O_3$ 16.6 g | $Al_2O_3$ 2.55 g AlN 8.2 g | $MnO_2$ 0.26 g | $BaF_2$ 2~3 g |
| 17 | $Y_{2.94}Al_5O_6N_4$:$Ce_{0.06}$ | $Y_2O_3$ 16.6 g | $Al_2O_3$ 2.55 g AlN 8.2 g | $CeO_2$ 0.52 g | $BaF_2$ 2~3 g |
| 18 | $Lu_{1.72}Gd_{1.2}Al_5O_6N_4$:$Ce_{0.05}Pr_{0.03}$ | $Lu_2O_3$ 17.11 g $Gd_2O_3$ 10.88 g | $Al_2O_3$ 2.55 g AlN 8.2 g | $CeO_2$ 0.43 g $Pr_6O_{11}$ 0.26 g | $BaF_2$ 2~3 g |
| 19 | $Lu_{1.72}Er_1Ga_5O_{4.5}N_5$:$Mn_{0.25}Dy_{0.03}$ | $Lu_2O_3$ 17.11 g $Er_2O_3$ 9.56 g | GaN 20.93 g | $Mn_2O_3$ 1.09 g $Dy_2O_3$ 0.28 g | $BaF_2$ 2~3 g |
| 20 | $Lu_{1.92}Sc_1Al_5O_6N_4$:$Ce_{0.05}Yb_{0.03}$ | $Lu_2O_3$ 19.1 g $Sc_2O_3$ 3.78 g | $Al_2O_3$ 2.55 g AlN 8.2 g | $CeO_2$ 0.43 g $Yb_2O_3$ 0.3 g | $BaF_2$ 2~3 g |
| 21 | $Sm_{1.92}La_1Al_5O_6N_4$:$Ce_{0.05}Ho_{0.03}$ | $La_2O_3$ 8.15 g $Sm_2O_3$ 16.74 g | $Al_2O_3$ 2.55 g AlN 8.2 g | $CeO_2$ 0.43 g $Ho_2O_3$ 0.28 g | $BaF_2$ 2~3 g |
| 22 | $Y_{2.32}Gd_{0.6}In_1Al_5O_6N_4$:$Ce_{0.05}Nd_{0.03}$ | $Y_2O_3$ 13.1 g $Gd_2O_3$ 5.44 g | $In_2O_3$ 6.94 g AlN 8.2 g | $CeO_2$ 0.43 g $Nd_2O_3$ 10.09 g | $BaF_2$ 2~3 g |

TABLE 1-continued

| | | Ingredient (g) Precursor compound | | | |
|---|---|---|---|---|---|
| Exp. | Formula | $M^1$ (g) | $M^2$ (g) | $M^3$ (g) | flux agent |
| 23 | $Lu_{1.95}Pm_1Al_5O_6N_4$: $Ce_{0.05}$ | $Lu_2O_3$ 19.4 g | $Al_2O_3$ 2.55 g AlN 8.2 g | $CeO_2$ 0.43 g $Pm_2O_3$ 8.45 g | $BaF_2$ 2~3 g |
| Comparative example | | | | | |
| 1 | YAG:Ce | Commercial Product | | | |
| 2 | YAG:Eu | Commercial Product | | | |
| 3 | BAM | Commercial Product | | | |
| 4 | $Y_3Al_2O_{7.5}$:Ce | $Y_2O_3$ 33.87 g | $Al_2O_3$ 10.2 g | $CeO_2$ 0.87 g | $BaF_2$ 2-3 g |

TABLE 2

| Exp. | Formula | Excitation Wavelength (nm) Color | Emission Wavelength (nm) color |
|---|---|---|---|
| 1 | $Y_{2.98}Al_5O_{7.6}N_3$:$Tm_{0.02}$ | ~400 Purple | 460 Blue |
| 2 | $Y_{2.95}Al_5O_6N_4$:$Bi_{0.05}$ | ~400 Purple | 450 Blue |
| 3 | $Y_{2.94}Al_5O_6N_4$:$Tb_{0.06}$ | ~400 Purple | 520 Green |
| 4 | $Y_{2.95}Al_5O_{7.5}N_3$:$Ce_{0.05}$ | 440~480 Blue | 530 Yellow-Green |
| 5 | $Y_{2.95}Al_5O_6N_4$:$Ce_{0.05}$ | 440~480 Blue | 530 Yellow-Green |
| 6 | $Y_{2.95}Al_5O_{4.5}N_5$:$Ce_{0.05}$ | 440~480 Blue | 530 Yellow |
| 7 | $Y_{2.95}Al_5O_6N_4$:$Mn_{0.05}$ | 440~480 Blue | 650 Red |
| 8 | $Y_{2.75}GaAl_4O_6N_4$:$Mn_{0.25}$ | 440~480 Blue | 675 Red |
| 9 | $Y_{2.94}Al_5N_8$:$Bi_{0.06}$ | ~400 Purple | 455 Blue |
| 10 | $Y_{2.94}Al_5N_8$:$Tm_{0.06}$ | ~400 Purple | 450 Blue |
| 11 | $Y_{2.95}Al_5N_8$:$Ce_{0.05}$ | 440~480 Blue | 530 Yellow |
| 12 | $Y_{2.95}Al_5N_8$:$Ce_{0.05}$ | 440~480 Blue | 530 Yellow |
| 13 | $Y_{2.95}Al_5N_8$:$Mn_{0.05}$ | 440~480 Blue | 650 Red |
| 14 | $Y_{2.95}Ga_5N_8$:$Mn_{0.05}$ | 440~480 Blue | 673 Red |
| 15 | $Y_{2.94}Al_5O_6N_4$:$Bi_{0.06}$ | ~400 Purple | 450 Blue |
| 16 | $Y_{2.94}Al_5O_6N_4$:$Mn_{0.06}$ | 440~480 Blue | 650 Red |
| 17 | $Y_{2.94}Al_5O_6N_4$:$Ce_{0.06}$ | 440~480 Blue | 530 Yellow |
| 18 | $Lu_{1.72}Gd_{1.2}Al_5O_6N_4$: $Ce_{0.05}Pr_{0.03}$ | 450~490 Blue | 540 Yellow-Green |
| 19 | $Lu_{1.72}Er_1Ga_5O_{4.5}N_5$: $Mn_{0.25}DY_{0.03}$ | 450~490 Blue | 675 Red |
| 20 | $Lu_{1.92}Sc_1Al_5O_6N_4$: $Ce_{0.05}Yb_{0.03}$ | 450~490 Blue | 525 Yellow-Green |
| 21 | $Sm_{1.92}La_1Al_5O_6N_4$: $Ce_{0.05}Ho_{0.03}$ | 450~490 Blue | 535 Yellow-Green |
| 22 | $Y_{2.32}Gd_{0.6}In_1Al_4O_6N_4$: $Ce_{0.05}Nd_{0.03}$ | 450~490 Blue | 550 Yellow-Green |
| 23 | $Lu_{1.95}Pm_1Al_5O_6N_4$: $Ce_{0.05}$ | 440~480 Blue | 530 Yellow-Green |
| Comparative Example | | | |
| 1 | YAG:Ce | 450~490 Blue | 530 Yellow |
| 2 | YAG:Eu | 400 Purple | 620 Red |
| 3 | BAM | 400 Purple | 450 Blue |
| 4 | $Y_3Al_2O_{7.5}$:Ce | 450-490 Purple | N/A |

As shown in Table 2, the fluorescent powder of Comparative example 1, YAG:Ce, is excited by blue light and emits yellow light with 530 nm peak wavelength; YAG:Eu of Comparative example 2 is excited by purple light and emits red light with 620 nm peak wavelength. This reveals that different co-activators ($M^3$) in the fluorescent powders result in different excitation and emission peak wavelengths.

The fluorescent powders of Example 1 to 23 do not consist of silicon or sulfur, and nitrogen is used to substitute part or all of oxygen atoms in the fluorescent powders. By combining different activators and different elements in the fluorescent powders of this invention, the fluorescent powders with emission wavelength ranging from 450 nm to 675 nm can be obtained.

From Examples 4 to 6, it is shown that increase in nitrogen content and decrease in oxygen content in the fluorescent powders do not affect peak wavelength of emission spectrum. The peak wavelength of emission spectrum is primarily related to the species of activators $M^3$ in fluorescent materials. When $M^3$ comprises $Tm^{3+}$ or $Bi^{3+}$, the fluorescent material emits blue light. When $M^3$ comprises $Tb^{3+}$ or $Ce^{3+}$, the fluorescent material emits green, yellow, or yellow-green light. When $M^3$ comprises $Eu^{3+}$ or $Mn^{3+}$, the fluorescent material emits red light. When $M^3$ in the fluorescent material comprises $Yb^{3+}$ or $Ho^{3+}$, the peak wavelength of emission spectrum of the fluorescent material ranges from 380 nm to 530 nm. When $M^3$ of fluorescent material comprises $Pr^{3+}$, $Dy^{3+}$, or $Nd^{3+}$, the peak wavelength of emission spectrum of the fluorescent material ranges from 540 nm to 675 nm.

Figure 1:
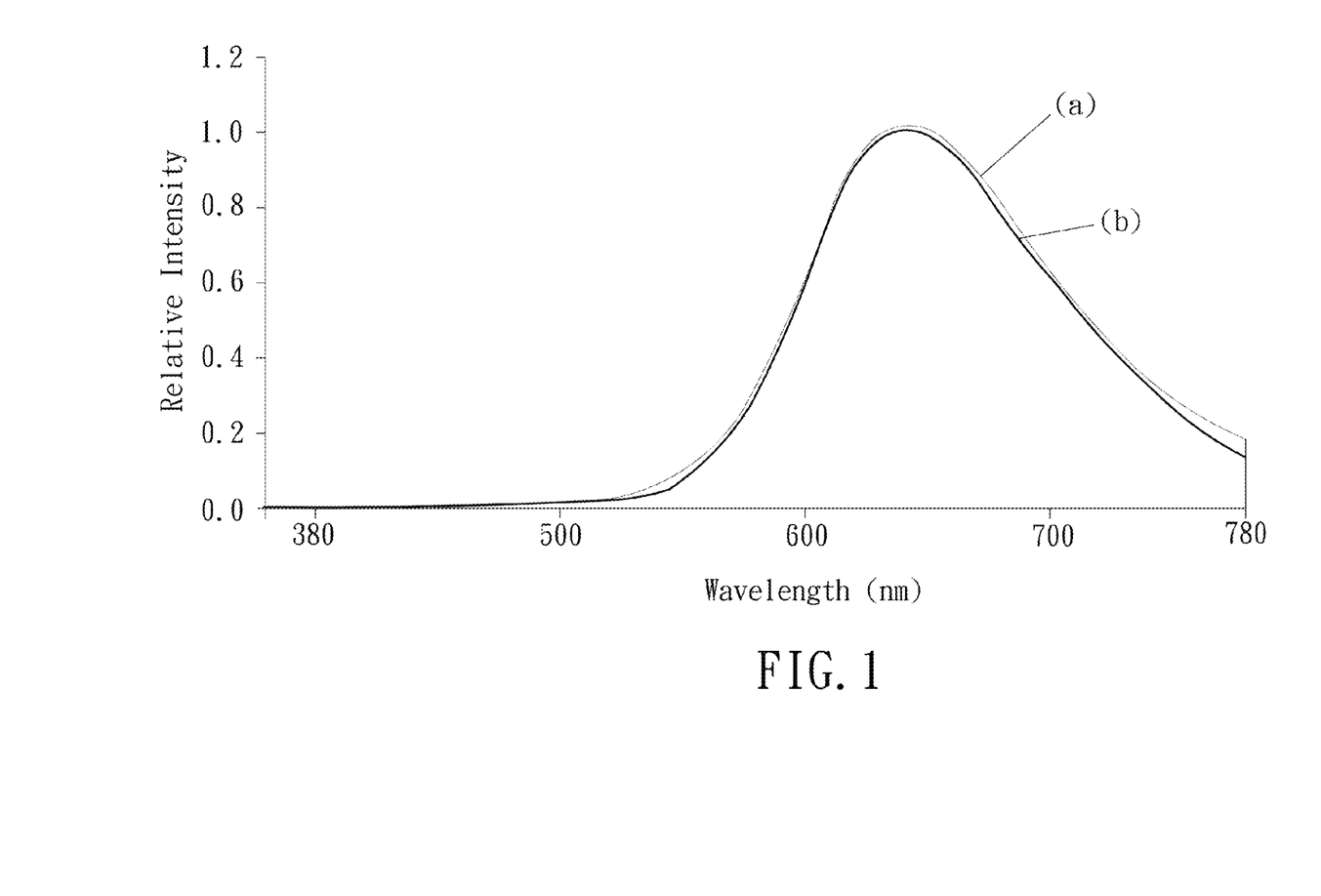
FIG. 1 is a graph illustrating relative emission spectra of Example 13 (curve (a)) and Comparative example 2 (curve (b))

FIG. 1 shows relative emission spectra of the fluorescent powders of Example 13 (curve (a)) and Comparative example 2 (curve (b)), each of which is excited by blue light with 460 nm wavelength. The results show that the fluorescent powder of Example 13 ($Y_{2.95}Al_5N_8$:$Mn_{0.05}$) has stronger photoluminescence intensity as compared to that of Comparative example 2 (YAG:Eu).

Figure 2:
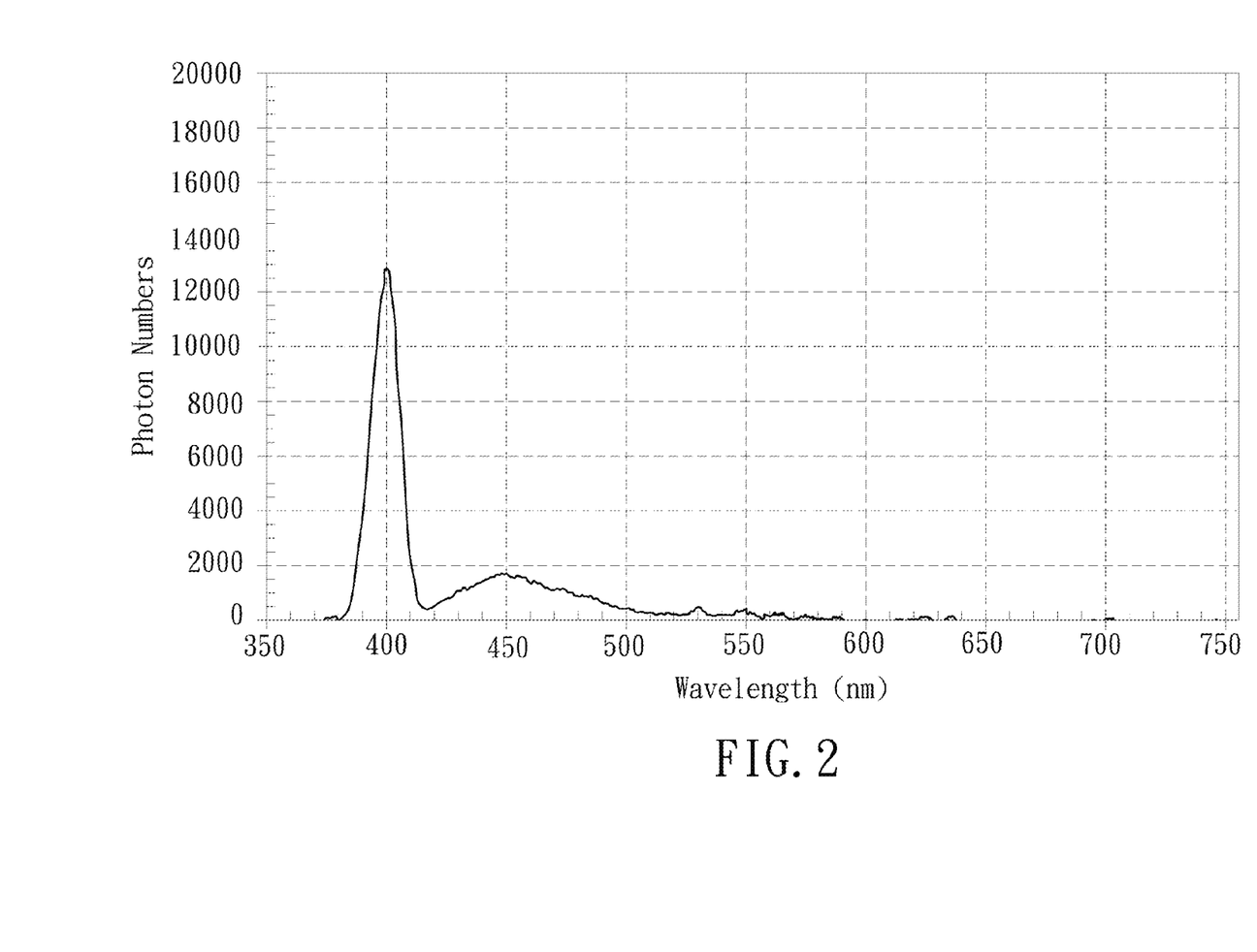
FIG. 2 is a spectrum of Comparative example 3 (BAM)
Figure 3:
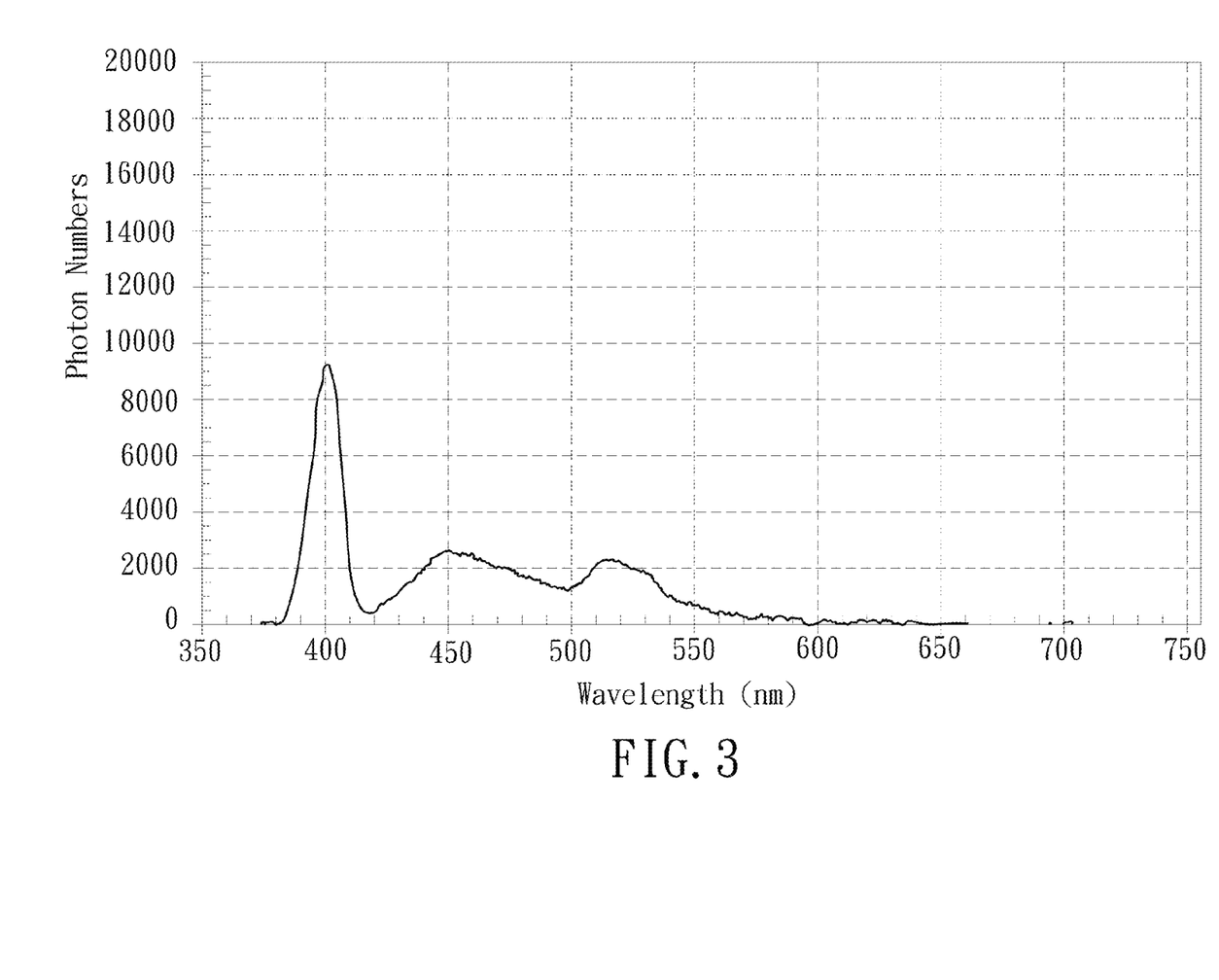
FIG. 3 is a spectrum of Example 15.

FIG. 2 shows the spectrum of the fluorescent powder of Comparative example 3 (BAM). When the fluorescent powder of Comparative example 3 is excited by purple light with a 400 nm peak wavelength, the emission peak wavelength is around 450 nm (blue light), and the average number of photon emitted per frequency in spectrum is 446.9. FIG. 3 is the spectrum for the fluorescent powder of Example 15 ($Y_{2.94}Al_5O_6N_4$:$Bi_{0.06}$), which is excited by purple light having a peak wavelength smaller than 400 nm. The fluorescent powder of Example 15 emits blue light with a 450 nm peak wavelength, and the average number of photon emitted per frequency in spectrum is 701.1, which indicates that the fluorescent powder of Example 15 has better illuminating efficiency than that of Comparative example 3.

Figure 4:
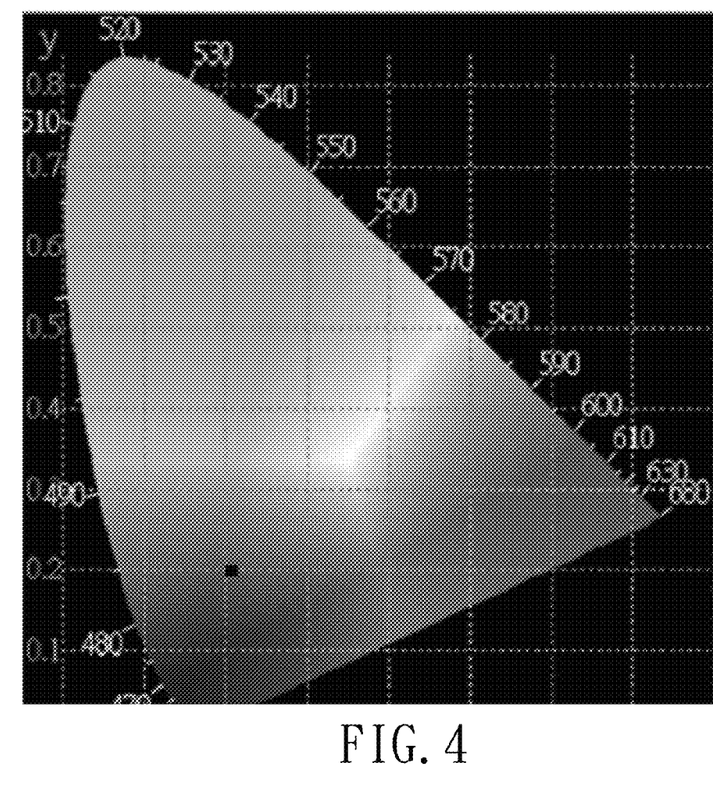
FIG. 4 is a chromaticity coordinate diagram of comparative example 4.

It is noted that the fluorescent powder of Comparative example 4 ($Y_3Al_2O_{7.5}$:Ce) is a white powder, and has different structure from other conventional YAG phosphor ($Y_3Al_{3-5}O_{9-12}$) FIG. 4 is a CIE chromaticity coordinate diagram for Comparative example 4, which shows a blue light output when the fluorescent material of comparative example 4 is excited by blue light with a peak emission wavelength of 450 nm. This indicates that no photoluminescence effect occurred in Comparative example 4.

Figure 5:
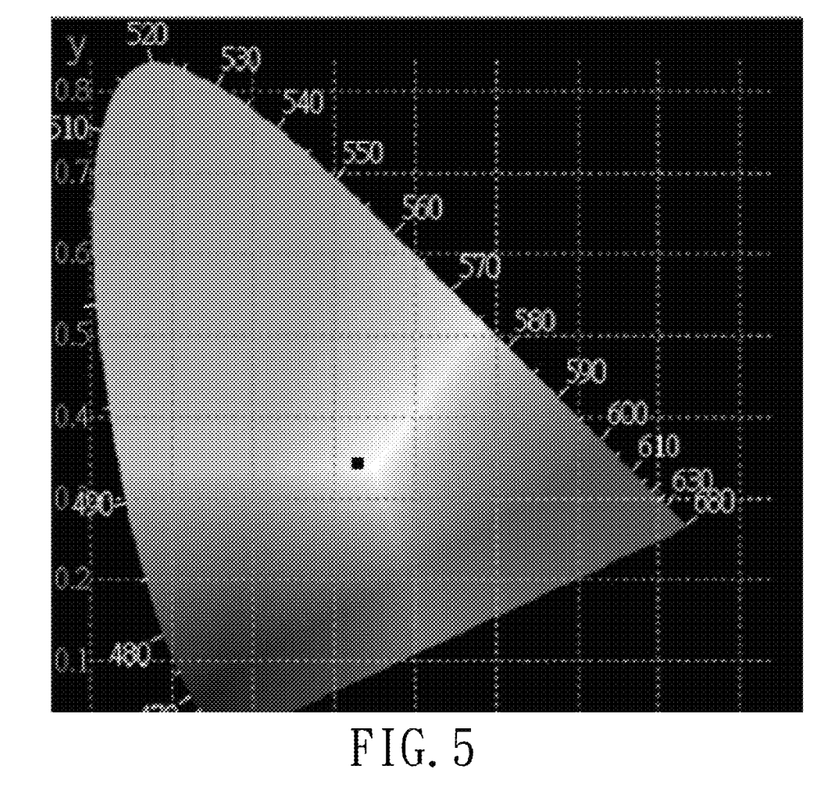
FIG. 5 is a chromaticity coordinate diagram of example 4.

As shown in FIG. 5, when the fluorescent powder of Example 4 is exposed to blue light with a peak emission wavelength of 450 nm, the chromaticity coordinates of example 4 are located in zone of white color. This indicates that the fluorescent powder of Example 4 emits yellow-greenish light, and the emitted yellow-greenish light mixes with part of blue light to form white light. The major difference in formula between the fluorescent powder of Example 4 and the fluorescent powder of Comparative example 4 is the atom numbers of Al and N. The difference in the atom numbers of Al and N between Example 4 and Comparative example 4 is $(AlN)_3$, which causes phosphor emission for the fluorescent powder of example 4. Based on formula (I), the difference in the atom numbers of Al and N between the fluorescent materials of this invention and conventional materials could range from 3 to 8.

Figure 6:
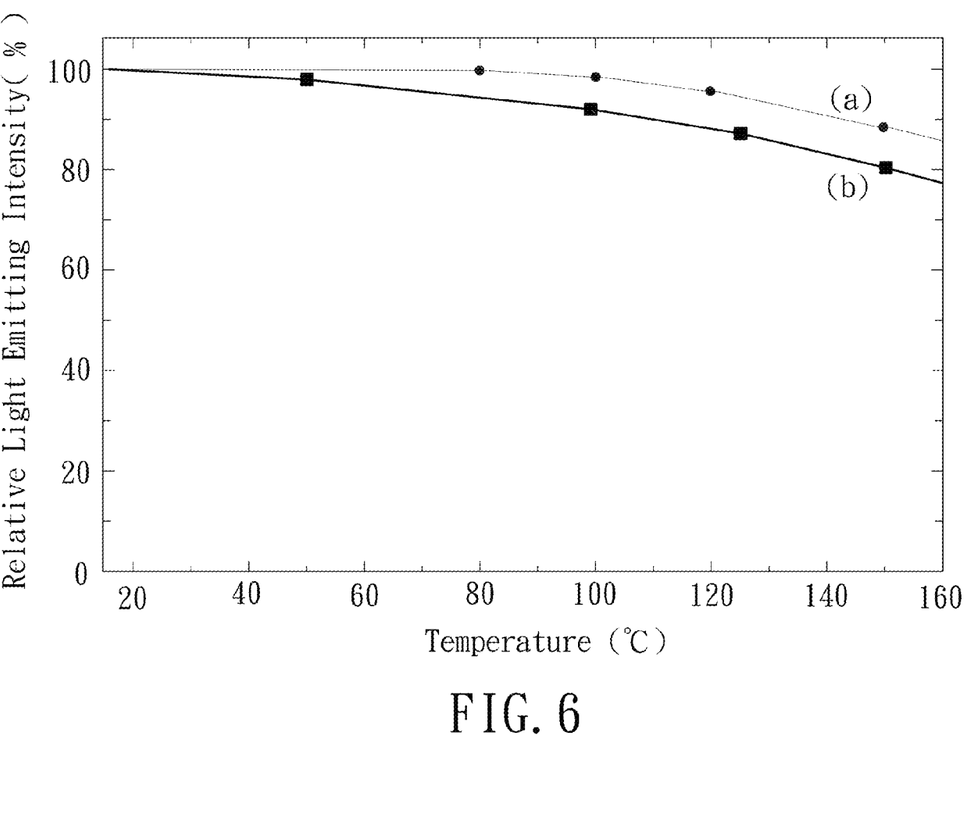
FIG. 6 is a graph describing degradation of light emission of example 5 (curve (a)) and comparative example 1 (curve (b)).

FIG. 6 is a graph showing degradation of light emission intensity with change of temperature for the fluorescent powders of Example 5 ($Y_{2.95}Al_5O_6N_4:Ce_{0.05}$) (curve (a)) and of Comparative example 1 (YAG:Ce) (curve (b)). FIG. 6 shows that degradation level of light emission intensity for Example 5 is less than that of Comparative example 1. It is suggested that the less degradation might be attributed to the covalent bond of nitrogen elements, which improves thermal resistance for the fluorescent powder of Example 5.

In the aspect of color rendering index, the conventional YAG fluorescent materials have color rendering index (Ra) of around 80%. Some other conventional fluorescent materials, which are modified by substituting aluminum element of YAG with silicon or sulfur element, have similar color rendering index (Ra) of around 80% since the structures thereof are similar to that of YAG. However, the color rendering index of the fluorescent materials of this invention might be greater than 85%, which is better than that of the conventional YAG or YAG-modified materials.

To sum up, by altering the species and the amount of element in the fluorescent material of this invention, the fluorescent materials irradiating different colors of light can be obtained. Also, substitution of part or all of oxygen atoms with nitrogen atoms in the fluorescent material of this invention would enhance the bonding strength through covalent bonds of nitrogen atoms. The fluorescent material of this invention has a sintering temperature of around 1800° C. and has good thermal resistance. Moreover, superior color rendering index can be achieved in this invention.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A fluorescent material represented by the following formula (I):

$$M^1{}_yM^2{}_nO_zN_x:M^3{}_w \qquad (I);$$

wherein $M^1$ is selected from the group consisting of $Sc^{3+}$, $Y^{3+}$, $La^{3+}$, $Sm^{3+}$, $Gd^{3+}$, $Pm^{3+}$, $Er^{3+}$, $Lu^{3+}$, and combinations thereof;

$M^2$ is selected from the group consisting of $Al^{3+}$, $In^{3+}$, $Ga^{3+}$, and combinations thereof;

$M^3$ is selected from the group consisting of $Tm^{3+}$, $Bi^{3+}$, $Tb^{3+}$, $Ce^{3+}$, $Eu^{3+}$, $Mn^{3+}$, $Er^{3+}$, $Yb^{3+}$, $Ho^{3+}$, $Gd^{3+}$, $Pr^{3+}$, $Dy^{3+}$, $Nd^{3+}$, and combinations thereof;

$0.6 \leq x/n \leq 1.6$, $0.54 \leq y/n \leq 0.6$, $0 < w/n \leq 0.06$, and $0 \leq z/n \leq 1.5$.

2. The fluorescent material of claim 1, wherein w/n ranges from 0.002 to 0.012.

3. The fluorescent material of claim 1, wherein $M^1$ and $M^3$ cannot be the same.

4. The fluorescent material of claim 1, selected from the group consisting of
$Y_{2.98}Al_5O_{7.5}N_3:Tm_{0.02}$, $Y_{2.95}Al_5O_6N_4:Bi_{0.05}$,
$Y_{2.94}Al_5O_6N_4:Tb_{0.06}$, $Y_{2.95}Al_5O_{7.5}N_3:Ce_{0.05}$,
$Y_{2.95}Al_5O_6N_4:Ce_{0.05}$, $Y_{2.95}Al_5O_{4.5}N_5:Ce_{0.05}$,
$Y_{2.95}Al_5O_6N_4:Mn_{0.05}$, $Y_{2.75}GaAl_4O_6N_4:Mn_{0.25}$,
$Y_{2.94}Al_5N_8:Bi_{0.06}$, $Y_{2.94}Al_5N_8:Tm_{0.06}$,
$Y_{2.95}Al_5N_8:Ce_{0.05}$, $Y_{2.95}Al_5N_8:Mn_{0.05}$,
$Y_{2.95}Ga_5N_8:Mn_{0.05}$, $Y_{2.94}Al_5O_6N_4:Bi_{0.06}$,
$Y_{2.94}Al_5O_6N_4:Mn_{0.06}$, $Y_{2.94}Al_5O_6N_4:Ce_{0.06}$,
$Lu_{1.72}Gd_{1.2}Al_5O_6N_4:Ce_{0.05}Pr_{0.03}$,
$Lu_{1.72}Er_1Ga_5O_{4.5}N_5:Mn_{0.25}Dy_{0.03}$,
$Lu_{1.92}Sc_1Al_5O_6N_4:Ce_{0.05}Yb_{0.03}$,
$Sm_{1.92}La_1Al_5O_6N_4:Ce_{0.05}Ho_{0.03}$,
$Y_{2.32}Gd_{0.6}In_1Al_4O_6N_4:Ce_{0.05}Nd_{0.03}$, and
$Lu_{1.95}Pm_1Al_5O_6N_4:Ce_{0.05}$.

5. The fluorescent material of claim 1, wherein said fluorescent material has an emission wavelength ranging from 380 nm to 700 nm.

6. The fluorescent material of claim 1, wherein said fluorescent material has an excitation wavelength ranging from 250 nm to 500 nm.

7. An illumination device, comprising:
a light emitting element; and
a fluorescent layer that is formed on said light emitting element, that includes a fluorescent material of claim 1, and that is capable of absorbing light emitting from said light emitting element.

8. The illumination device of claim 7, wherein said fluorescent material has an emission wavelength ranging from 380 nm to 700 nm.

* * * * *